(12) United States Patent
Katoch et al.

(10) Patent No.: US 10,878,867 B2
(45) Date of Patent: Dec. 29, 2020

(54) MEMORY CELL DISTANCE TRACKING CIRCUITS AND METHODS

(71) Applicant: TAIWAN SEMICONDUCTOR MANUFACTURING COMPANY, LTD., Hsinchu (TW)

(72) Inventors: Atul Katoch, Kanata (CA); Hyunsung Hong, Kanata (CA)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 16/018,892

(22) Filed: Jun. 26, 2018

(65) Prior Publication Data
US 2019/0392876 A1    Dec. 26, 2019

(51) Int. Cl.
| G11C 8/08 | (2006.01) |
|---|---|
| G11C 7/06 | (2006.01) |
| G11C 7/22 | (2006.01) |
| G11C 7/10 | (2006.01) |
| G11C 8/10 | (2006.01) |

(52) U.S. Cl.
CPC .................. *G11C 8/08* (2013.01); *G11C 7/06* (2013.01); *G11C 7/10* (2013.01); *G11C 7/22* (2013.01); *G11C 8/10* (2013.01)

(58) Field of Classification Search
CPC ..... G11C 8/08; G11C 8/10; G11C 7/10; G11C 7/06; G11C 7/22
See application file for complete search history.

(56) References Cited

U.S. PATENT DOCUMENTS

| 6,462,998 B1* | 10/2002 | Proebsting | G11C 7/04 257/E21.659 |
|---|---|---|---|
| 8,760,948 B2* | 6/2014 | Tao | G11C 7/08 365/191 |
| 9,990,972 B1* | 6/2018 | Kwon | G11C 7/227 |
| 2008/0247249 A1* | 10/2008 | Lee | G11C 5/025 365/205 |
| 2008/0298143 A1* | 12/2008 | Chen | G11C 7/22 365/194 |
| 2013/0039137 A1* | 2/2013 | Yasuda | G11C 7/08 365/194 |

* cited by examiner

*Primary Examiner* — Jerome Leboeuf
(74) *Attorney, Agent, or Firm* — Hauptman Ham, LLP

(57) ABSTRACT

A circuit includes a plurality of memory cells, a first tracking word line driver, and a second tracking word line driver. The first tracking word line driver outputs a first signal in response to a first region of the plurality of memory cells being accessed, the first signal having a first pulse width. The second tracking word line driver outputs a second signal in response to a second region of the plurality of memory cells being accessed, the second signal having a second pulse width, the second pulse width being different from the first pulse width.

20 Claims, 7 Drawing Sheets

700

| 710 | Activate a memory cell |

| 720 | Activate a tracking cell using a tracking word line driver of a plurality of tracking word line drivers |

| 730 | Detect a charged or discharged status of a tracking bit line coupled with the tracking cell |

| 740 | Enable the sense amplifier, a delay from the activating the memory cell to the enabling the sense amplifier being based on a distance between the memory cell and the sense amplifier |

| 750 | Deactivate the memory cell |

FIG. 7

MEMORY CELL DISTANCE TRACKING CIRCUITS AND METHODS

BACKGROUND

Memory array data access includes read and write operations that are influenced by integrated circuit (IC) characteristics such as parasitic resistance and capacitance levels, operating voltages, and temperature and manufacturing process variations. The influence of these characteristics often relates to the speeds at which data are accessed and the power consumed during read and write operations.

To address performance variations, a number of approaches are used in which memory circuits are designed to accommodate an expected range of values for a given characteristic.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is a flowchart of a method of performing a read operation on a memory cell, in accordance with some embodiments.

DETAILED DESCRIPTION

Figure 1:
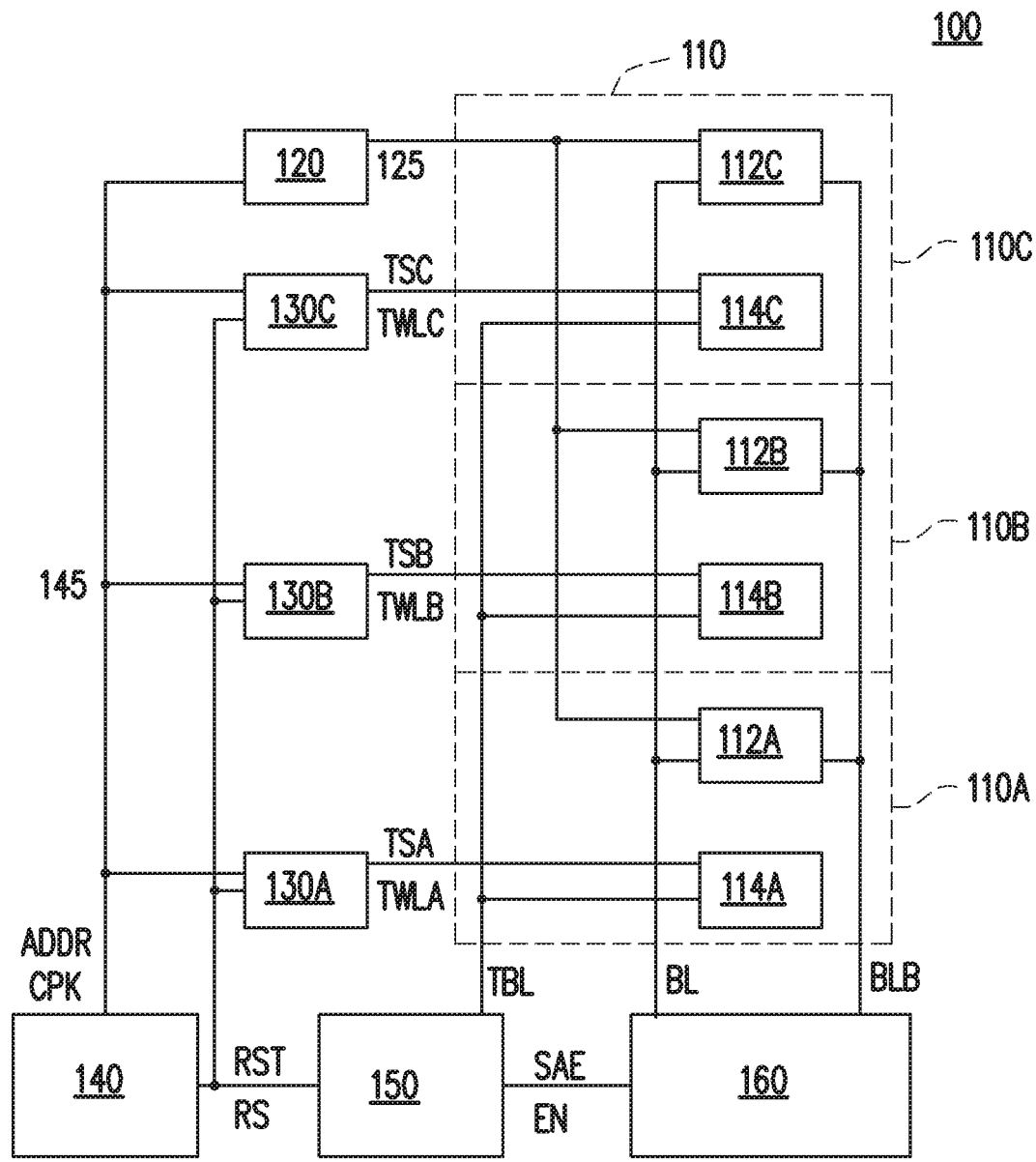
FIG. 1 is a diagram of a memory circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a memory circuit includes multiple tracking cell sets, each tracking cell set driven by a separate tracking word line driver and coupled with a common tracking bit line. Each tracking cell set is located in a region of memory cells coupled with a sense amplifier by a bit line, the regions having distances to the sense amplifier that range from nearest to farthest. Due to bit line capacitance and resistance, memory and tracking cells in regions near the sense amplifier charge or discharge bit lines more quickly than those in regions relatively far from the sense amplifier.

In a read operation on a memory cell in a given region, the associated tracking cell set is activated, and the read operation is performed based on timing of the tracking cell set. Thus, for a memory cell near the sense amplifier compared to a memory cell relatively far from the sense amplifier, the read operation time, including the duration of bit line charging or discharging, is reduced. By reducing bit line charging or discharging times for memory cells near the sense amplifier, overall power consumption of the memory circuit is reduced compared to approaches that do not reduce bit line charging or discharging times for memory cells near the sense amplifier.

FIG. 1 is a diagram of a memory circuit 100, in accordance with some embodiments. Memory circuit 100 includes a plurality of memory cells 110 (not individually represented or labeled) having regions 110A, 110B, and 110C, a plurality of word line drivers 120 (not individually represented or labeled), tracking word line drivers 130A, 130B, and 130C, a decoder circuit 140, a tracking circuit 150, and a sense amplifier 160.

Plurality of word line drivers 120 is communicatively coupled with plurality of memory cells 110 through a word line bus 125. Tracking word line driver 130A is communicatively coupled with region 110A through a tracking word line TWLA, tracking word line driver 130B is communicatively coupled with region 110B through a tracking word line TWLB, and tracking word line driver 130C is communicatively coupled with region 110C through a tracking word line TWLC.

Decoder circuit 140 is communicatively coupled with plurality of word line drivers 120 and each of tracking word line drivers 130A, 130B, and 130C through an address information bus 145. Decoder circuit 140 is communicatively coupled with each of tracking word line drivers 130A, 130B, and 130C and tracking circuit 150 through a reset line RS.

Two or more circuit elements are considered to be communicatively coupled based on a direct signal connection or on an indirect signal connection that includes one or more logic devices, e.g., an inverter or logic gate, between the two or more circuit elements. In some embodiments, signal communications between the two or more communicatively coupled circuit elements are capable of being modified, e.g., inverted or made conditional, by the one or more logic devices.

Tracking circuit 150 is electrically coupled with each of regions 110A, 110B, and 110C through a tracking bit line TBL, and is communicatively coupled with sense amplifier 160 through an enable line EN. Sense amplifier 160 is electrically coupled with plurality of memory cells 110 through a bit line BL and a bit line BLB.

Two or more circuit elements are considered to be electrically coupled based on a direct electrical connection or an electrical connection that includes one or more additional circuit elements and is thereby capable of being controlled, e.g., made resistive or open by a transistor or other switching device.

Memory circuit 100 is a subset of a memory macro that includes one or more additional components, e.g., at least one plurality of memory cells (not shown) in addition to plurality of memory cells 110.

In the embodiment depicted in FIG. 1, memory circuit 100 includes three regions 110A, 110B, and 110C, each region associated with corresponding circuitry. In various embodiments, memory circuit 100 includes only two of regions 110A, 110B, or 110C, along with associated circuitry, or includes one or more regions and associated circuitry (not shown) in addition to regions 110A, 110B, and 110C.

As discussed below, each region, e.g., regions 110A, 110B, and 110C, and the associated circuitry of memory circuit 100 is associated with performance improvement and increased circuit area. Accordingly, a tradeoff exists such that both the performance improvement and area penalty increase as the number of regions increases, and both the performance improvement and area penalty decrease as the number of regions decreases.

Plurality of memory cells 110 includes electrical, electromechanical, electromagnetic, or other devices (not individually labeled) configured to store bit data represented by logical states. The logical states of the memory cells in plurality of memory cells 110 are capable of being programmed in a write operation and detected in a read operation.

In some embodiments, a logical state corresponds to a voltage level of an electrical charge stored in a given memory cell. In some embodiments, a logical state corresponds to a physical property, e.g., a resistance or magnetic orientation, of a component of a given memory cell.

In some embodiments, plurality of memory cells 110 includes static random-access memory (SRAM) cells. In various embodiments, SRAM cells include five-transistor (5T) SRAM cells, six-transistor (6T) SRAM cells, eight-transistor (8T) SRAM cells, nine-transistor (9T) SRAM cells, or SRAM cells having other numbers of transistors. In some embodiments, plurality of memory cells 110 includes dynamic random-access memory (DRAM) cells or other memory cell types capable of storing bit data.

Each memory cell of plurality of memory cells 110 is configured to, responsive to a word line signal received on word line bus 125, electrically couple with one or both of bit lines BL and BLB, thereby enabling one or both of bit lines BL or BLB to be charged or discharged in a read operation in accordance with the logical state stored in the memory cell.

In a read operation, in some embodiments, discharging one or both of bit lines BL or BLB includes biasing a voltage level on the one or both of bit lines BL or BLB toward a reference voltage VSS (not labeled in FIG. 1) of memory circuit 100. In a read operation, in some embodiments, charging one or both of bit lines BL or BLB includes biasing the voltage level on the one or both of bit lines BL or BLB toward a power supply voltage VDD (not labeled in FIG. 1) of memory circuit 100.

In some embodiments, power supply voltage VDD corresponds to logically high states and reference voltage VSS corresponds to logically low states in memory circuit 100.

Each of bit lines BL and BLB includes a conductive line configured to couple each memory cell of plurality of memory cells 110 with sense amplifier 160. In the embodiment depicted in FIG. 1, memory circuit 100 is configured so that, in a read operation, bit lines BL and BLB have voltage levels corresponding to complementary logical states. In various embodiments, memory circuit 100 includes only one of bit lines BL or BLB, or is configured so that BL and BLB have voltage levels that do not necessarily correspond to complementary logical states in a read operation.

Sense amplifier 160 includes one or more circuits configured to, responsive to an enable signal SAE received on enable line EN in a read operation, determine a logical state of a memory cell coupled with bit lines BL and BLB based on voltage levels on one or both of bit lines BL or BLB at one or more inputs (not labeled) of sense amplifier 160.

In the read operation, sense amplifier 160 is configured to respond to enable signal SAE having a logical value indicative of performing the logical state determination for a predetermined time period. The predetermined time period is configured to be sufficiently long to allow sense amplifier 160 to achieve a steady state indicative of the voltage levels on the one or both of bit lines BL or BLB at the one or more inputs of sense amplifier 160.

Plurality of memory cells 110 includes a subset of memory cells 112A in region 110A, a subset of memory cells 112B in region 110B, and a subset of memory cells 112C in region 110C. In the embodiment depicted in FIG. 1, plurality of memory cells 110 includes subsets 112A, 112B, and 112C arranged in a column or a portion of a column, with sense amplifier 160 positioned at the bottom of the column or portion of the column, thereby being positioned nearest to subset 112A and farthest from subset 112C.

In various embodiments, plurality of memory cells 110 includes subsets 112A, 112B, and 112C, and sense amplifier 160 having an arrangement other than the arrangement depicted in FIG. 1 such that sense amplifier 160 is otherwise positioned nearest to subset 112C and farthest from subset 112A, e.g., sense amplifier 160 positioned at the top of a column including subsets 112A, 112B, and 112C in an inverted orientation compared to the orientation depicted in FIG. 1.

In some embodiments, plurality of memory cells 110 includes a number of memory cells ranging from 128 to 1024. In various embodiments, plurality of memory cells 110 includes 256 memory cells, 512 memory cells, fewer than 128 memory cells, or greater than 1024 memory cells.

Because a memory macro including memory circuit 100 includes one or more circuits capable of interacting with each memory cell of plurality of memory cells 110, a number of memory cells fewer than 128 reduces the efficiency of the memory macro in some cases.

Because bit lines BL and BLB correspond to plurality of memory cells 110, lengths, and therefore capacitance and resistance values, of bit lines BL and BLB increase as a number of memory cells of plurality of memory cells 110 increases. A number of memory cells greater than 1024 therefore increases the effects of bit line capacitance and resistance on write and read operations on plurality of memory cells 110.

In some embodiments, each subset, e.g., each of subsets 112A, 112B, and 112C, of plurality of memory cells 110 has a same number of memory cells. In some embodiments, one or more subsets, e.g., one or more of subsets 112A, 112B, and 112C, of plurality of memory cells 110 has a number of memory cells that differs from a number of memory cells of one or more other subsets of plurality of memory cells 110.

Plurality of word line drivers 120 includes a plurality of circuits, e.g., word line drivers 520-1 through 520-M discussed below with respect to FIGS. 5A and 5B, configured to output word line signals on word line bus 125 corresponding to each memory cell of plurality of memory cells 110. Plurality of word line drivers 120 is configured to output the word line signal for a given memory cell responsive to address signals ADDR received on address information bus 145 corresponding to the given memory cell. Address signals ADDR includes a plurality of signals having logical states indicative of an address of the given memory cell.

Plurality of word line drivers 120 is configured to output the word line signal for a given memory cell further responsive to timing information received on address information bus 145. In the embodiment depicted in FIG. 1, the timing information includes a timing signal CPK having logical states indicative of the timing information. In some embodiments, the timing information is included in address signals ADDR. The timing information corresponds to read operations on plurality of memory cells 110, as discussed below.

Decoder 140 includes one or more circuits configured to output address signals ADDR on address information bus 145 responsive to one or more signals received on one or more additional buses (not shown), and to output the timing information on address information bus 145 responsive to the one or more signals received on the one or more additional buses and responsive to a reset signal RST received on reset line RS.

In addition to respective subsets 112A, 112B, and 112C, region 110A includes tracking cell set 114A, region 110B includes tracking cell set 114B, and region 110C includes tracking cell set 114C.

Each of tracking cell sets 114A, 114B, and 114C includes one or more tracking cells, e.g., tracking cells 300-1 through 300-N discussed below with respect to FIG. 3. A tracking cell includes an electrical, electromechanical, electromagnetic, or other device having a timing characteristic corresponding to a timing of a read operation on a memory cell of plurality of memory cells 110.

In various embodiments, a tracking cell includes a replica of a memory cell, a subset or a superset of a memory cell, or a circuit otherwise configured to have the timing characteristic corresponding to the timing of the read operation on a memory cell of plurality of memory cells 110.

In various embodiments, each tracking cell set 114A, 114B, and 114C has a number of tracking cells ranging from two to sixteen, a single tracking cell, or more than sixteen tracking cells. As the number of tracking cells increases, process variation effects decrease due to averaging at the cost of increased area for the tracking cell set. Accordingly, a tradeoff exists such that both process variation mitigation and area penalty increase as the number of tracking cells increases, and both process variation mitigation and area penalty decrease as the number of tracking cells decreases.

Tracking bit line TBL includes a conductive line configured to couple each tracking cell of tracking cell sets 114A, 114B, and 114C with tracking circuit 150.

Tracking circuit 150 is positioned relative to regions 110A, 110B, and 110C similarly to sense amplifier 160. Accordingly, tracking cell set 114A is nearest to tracking circuit 150, and tracking cell set 114C is farthest from tracking circuit 150.

Tracking circuit 150 includes one or more logic circuits configured to, responsive to a voltage level on tracking bit line TBL at an input (not labeled) of tracking circuit 150, determine a charged or discharged state of tracking bit line TBL. Tracking circuit 150 is configured to determine the charged or discharged state of tracking bit line TBL based on a sensed voltage level on tracking bit line TBL being within a predetermined threshold of a target voltage value. In various embodiments, the target voltage value is either reference voltage VSS or power supply voltage VDD.

Tracking circuit 150 is configured to, based on the determination, output enable signal SAE on enable line EN and reset signal RST on reset line RS, signals SAE and RST having logical states indicative of the charged or discharged state of tracking bit line TBL. Tracking circuit 150 is configured to output enable signal SAE having the predetermined time period discussed above with respect to sense amplifier 160.

In various embodiments, tracking circuit 150 is configured to apply one or more predetermined delays after determining the charged or discharged state of tracking bit line TBL and before outputting one or both of signals SAE or RST having the logical state indicative of the charged or discharged state of tracking bit line TBL. In some embodiments, the one or more predetermined delays have values based on the number of tracking cells in one or more of tracking cell sets 114A, 114B, or 114C.

Each tracking cell of tracking cell set 114A is configured to, responsive to a tracking word line signal TSA received on tracking word line TWLA, electrically couple with tracking bit line TBL, thereby enabling tracking bit line TBL to be charged or discharged having a timing in accordance with a distance from tracking cell set 114A to tracking circuit 150.

Each tracking cell of tracking cell set 114B is configured to, responsive to a tracking word line signal TSB received on tracking word line TWLB, electrically couple with tracking bit line TBL, thereby enabling tracking bit line TBL to be charged or discharged having a timing in accordance with a distance from tracking cell set 114A to tracking circuit 150.

Each tracking cell of tracking cell set 114C is configured to, responsive to a tracking word line signal TSC received on tracking word line TWLC, electrically couple with tracking bit line TBL, thereby enabling tracking bit line TBL to be charged or discharged having a timing in accordance with a distance from tracking cell set 114A to tracking circuit 150.

Because tracking bit line TBL has resistance and capacitance values that increase with length, a tracking cell coupled with tracking bit line TBL near tracking circuit 150 charges or discharges a voltage level at tracking circuit 150 more quickly than a tracking cell coupled with tracking bit line TBL far from tracking circuit 150.

Similarly, because bit lines BL and BLB have resistance and capacitance values that increase with length, a memory cell coupled with bit lines BL and BLB near sense amplifier 160 charges or discharges a voltage level at sense amplifier 160 more quickly than a memory cell coupled with bit lines BL and BLB far from sense amplifier 160.

By the configuration discussed above, in operation, a tracking cell in tracking cell set 114A charges or discharges tracking bit line TBL at tracking circuit 150 with a first timing corresponding to timing of a memory cell in subset 112A charging or discharging bit line BL or BLB at sense amplifier 160, a tracking cell in tracking cell set 114B charges or discharges tracking bit line TBL at tracking circuit 150 with a second timing corresponding to timing of a memory cell in subset 112B charging or discharging bit line BL or BLB at sense amplifier 160, and a tracking cell in tracking cell set 114C charges or discharges tracking bit line TBL at tracking circuit 150 with a third timing corresponding to timing of a memory cell in subset 112C charging or discharging bit line BL or BLB at sense amplifier 160.

Based on the relative proximity of tracking cell sets 114A, 114B, and 114C to tracking circuit 150, the first timing is faster than the second timing, and the second timing is faster than the third timing.

Each of tracking word line drivers 130A, 130B, and 130C includes a circuit, e.g., tracking word line driver 400 discussed below with respect to FIG. 4, configured to output the corresponding tracking word line signal TSA, TSB, or TSC on corresponding tracking word line TWLA, TWLB, or TWLC responsive to address signals ADDR and timing signal CPK received on address information bus 145.

Tracking word line driver 130A is configured to output tracking word line signal TSA on tracking word line TWLA having a logical state that causes tracking cell set 114A to couple with tracking bit line TBL in response to address signals ADDR corresponding to a memory cell in subset 112A.

Tracking word line driver 130B is configured to output tracking word line signal TSB on tracking word line TWLB having a logical state that causes tracking cell set 114B to couple with tracking bit line TBL in response to address signals ADDR corresponding to a memory cell in subset 112B.

Tracking word line driver 130C is configured to output tracking word line signal TSC on tracking word line TWLC having a logical state that causes tracking cell set 114C to couple with tracking bit line TBL in response to address signals ADDR corresponding to a memory cell in subset 112C.

As discussed above, tracking circuit 150 is configured to output reset signal RST responsive to the timings at which tracking cell sets 114A, 114B, and 114C charge or discharge tracking bit line TBL, decoder 140 is configured to output the timing information responsive to reset signal RST received from tracking circuit 150, and plurality of word line drivers 120 is configured to output the word line signals responsive to the timing information received from decoder 140.

As also discussed above, tracking circuit 150 is configured to output enable signal SAE responsive to the timings at which tracking cell sets 114A, 114B, and 114C charge or discharge tracking bit line TBL, and sense amplifier 160 is configured to perform read operations on plurality of memory cells 110 responsive to enable signal SAE.

Memory circuit 100 is thereby configured to perform read operations on plurality of memory cells 110 using word line signals and enable signal SAE responsive to timings at which tracking cell sets 114A, 114B, and 114C charge or discharge tracking bit line TBL.

Specifically, memory circuit 100 is configured so that a read operation on a memory cell in subset 112A is performed having a timing based on tracking cell set 114A driven by tracking word line driver 130A, a read operation on a memory cell in subset 112B is performed having a timing based on tracking cell set 114B driven by tracking word line driver 130B, and a read operation on a memory cell in subset 112C is performed having a timing based on tracking cell set 114C driven by tracking word line driver 130C.

During the read operation on a given memory cell of plurality of memory cells 110, memory circuit 100 is configured so that a logical state of the associated word line signal that causes the memory cell to couple with one or both of bit lines BL or BLB has a sufficiently long pulse width to ensure that sense amplifier 160 accurately determines the logical state of the given memory cell. In various embodiments, the pulse width is either a duration of a logically high state or a duration of a logically low state.

During the read operation on the given memory cell, the logical state of the associated word line signal also causes current to flow while the given memory cell charges or discharges one or both of bit lines BL or BLB. The pulse width duration therefore affects the power consumption of memory circuit 100 such that power consumption increases with increasing pulse widths.

By the configuration discussed above, and as discussed below with respect to FIG. 2, word line signals corresponding to memory cells in subset 112A have first pulse widths based on the first timing, word line signals corresponding to memory cells in subset 112B have second pulse widths based on the second timing, and word line signals corresponding to memory cells in subset 112C have third pulse widths based on the third timing. Accordingly, the first pulse widths are smaller than the second pulse widths, and the second pulse widths are smaller than the third pulse widths.

Because read operations are normally distributed among memory cells in each of subsets 112A, 112B, and 112C, on average, the power consumption of memory circuit 100 is less than power consumption in approaches in which all word line signals have a single pulse width sufficiently long to ensure that a sense amplifier accurately determines the logical state of a memory cell farthest from the sense amplifier.

Figure 2:
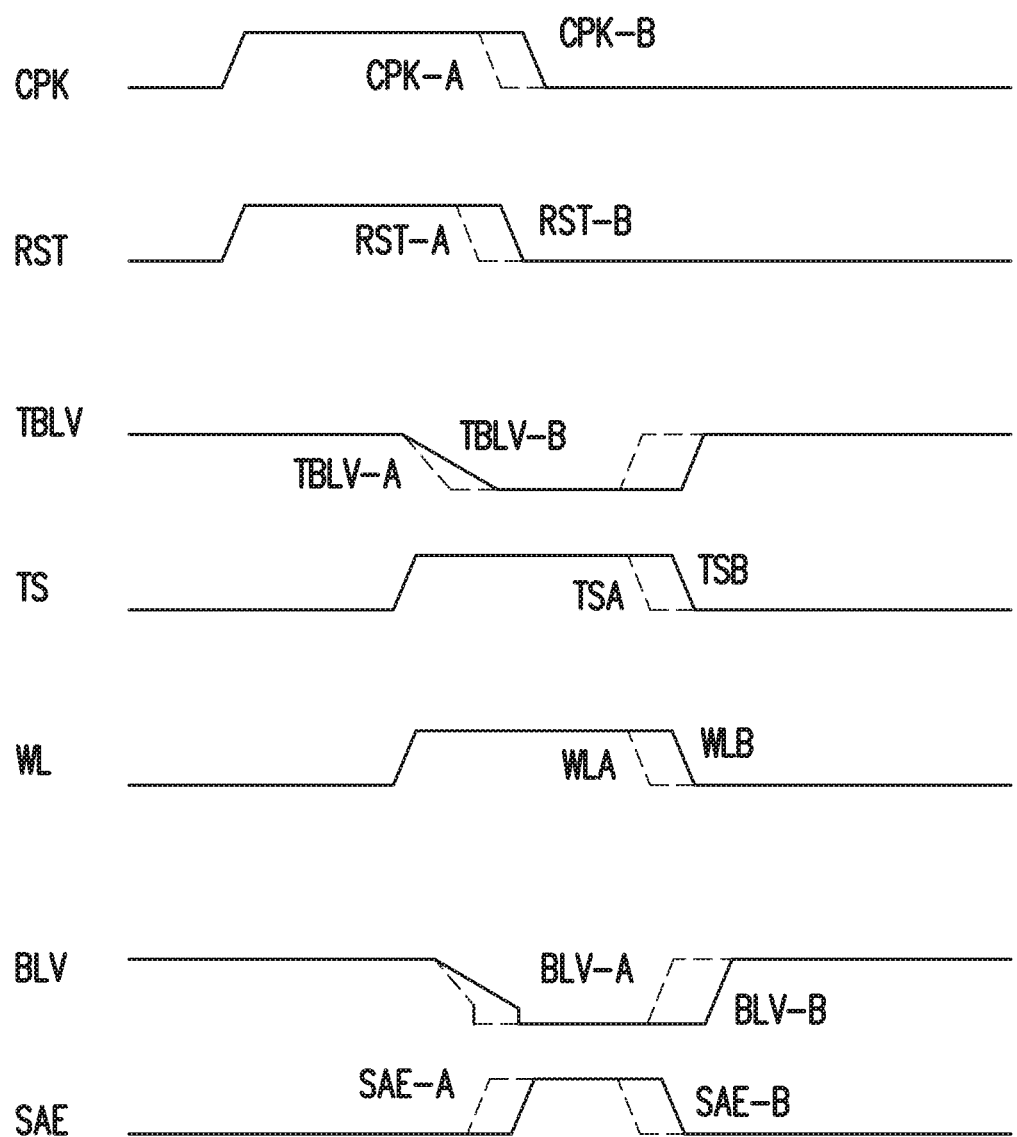
FIG. 2 is a plot of memory circuit operating parameters, in accordance with some embodiments.

FIG. 2 is a plot of memory circuit 100 operating parameters, in accordance with some embodiments. FIG. 2 depicts each of timing signal CPK, reset signal RST, a signal TBLV, a tracking word line signal TS, a word line signal WL, a signal BLV, and enable signal SAE as a function of time, in each case including representations corresponding to each of regions 110A and 110B discussed above with respect to FIG. 1.

FIG. 2 depicts relative relationships between signals associated with region 110A and the same signals associated with region 110B. The depicted signals are non-limiting examples of relative timing relationships and are applicable to signals associated with regions other than regions 110A or 110B.

In various embodiments, one or more of the signals depicted in FIG. 2 have one or more of a magnitude, a polarity, a duration, a slope, a timing relative to another signal, or another characteristic that differs from that depicted in FIG. 2.

Timing signal CPK has a leading edge based on a clock signal (not shown) and a falling edge based on reset signal RST, and includes a timing signal CPK-A associated with region 110A and a timing signal CPK-B associated with region 110B. Reset signal RST has a leading edge based on the clock signal and a falling edge based on the tracking bit line TBL voltage level, and includes a reset signal RST-A associated with region 110A and a reset signal RST-B associated with region 110B.

The tracking bit line TBL voltage level is depicted as signal TBLV, and includes a signal TBLV-A associated with region 110A and a signal TBLV-B associated with region 110B. As discussed above, because tracking cell set 114A is nearer to tracking circuit 150 than is tracking cell set 114B, tracking cell set 114A discharges tracking bit line TBL from a maximum value more quickly than does tracking cell set 114B. Thus, signal TBLV-A reaches a minimum value before signal TBLV-B reaches the minimum value.

Because the falling edge of reset signal RST is based on tracking circuit 150 detecting signal TBLV being within a predetermined threshold of the minimum value, the falling edge of reset signal RST-A precedes the falling edge of reset signal RST-B. Accordingly, the falling edge of timing signal CPK-A precedes the falling edge of timing signal CPK-B.

Tracking word line signal TS has a leading edge based on the clock signal and a falling edge based on reset signal RST, and includes tracking word line signal TSA associated with region 110A and tracking word line signal TSB associated with region 110B. Because the falling edge of reset signal RST-A precedes the falling edge of reset signal RST-B, the falling edge of tracking word line signal TSA precedes the falling edge of tracking word line signal TSB, and tracking word line signal TSA has a pulse with a smaller pulse width than does tracking word line signal TSB.

Because the falling edge of tracking word line signal TSA precedes the falling edge of tracking word line signal TSB, signal TBLV-A returns to the maximum value before signal TBLV-B returns to the maximum value.

Word line signal WL has a leading edge based on the clock signal and a falling edge based on reset signal RST, and includes a word line signal WLA associated with region 110A and a word line signal WLB associated with region 110B. Because the falling edge of reset signal RST-A precedes the falling edge of reset signal RST-B, the falling edge of word line signal WLA precedes the falling edge of word line signal WLB, and word line signal WLA has a pulse with a smaller pulse width than does word line signal WLB.

The voltage level on one of bit lines BL or BLB is depicted as signal BLV, and includes a signal BLV-A associated with region 110A and a signal BLV-B associated with region 110B. As discussed above, because subset 112A is nearer to sense amplifier 160 than is subset 112B, subset 112A discharges bit line BL or BLB from a maximum value more quickly than does subset 112B. Thus, signal BLV-A reaches a minimum value before signal BLV-B reaches the minimum value.

Because the falling edge of signal WLA precedes the falling edge of signal WLB, termination of the discharging of bit line BL or BLB in region 110A precedes termination of the discharging of bit line BL or BLB in region 110B, represented by signal BLV-A returning to the maximum value before signal BLV-B returns to the maximum value.

Enable signal SAE has leading and falling edges based on the falling edge of reset signal RST, and includes an enable signal SAE-A associated with region 110A and an enable signal SAE-B associated with region 110B. The leading and falling edges of enable signal SAE define a pulse having a pulse width corresponding to the predetermined time period discussed above with respect to tracking circuit 150, sense amplifier 160, and FIG. 1.

Because the falling edge of reset signal RST-A precedes the falling edge of reset signal RST-B, the pulse of enable signal SAE-A precedes the pulse of enable signal SAE-B, the pulse of enable signal SAE-A is coordinated with signal BLV-A, and the pulse of enable signal SAE-B is coordinated with signal BLV-B.

By the configuration discussed above with respect to FIG. 1, memory circuit 100 is capable of having relative timing between regions as discussed above with respect to FIG. 2, thereby reducing average power consumption compared to other approaches, as discussed above with respect to memory circuit 100.

Figure 3:
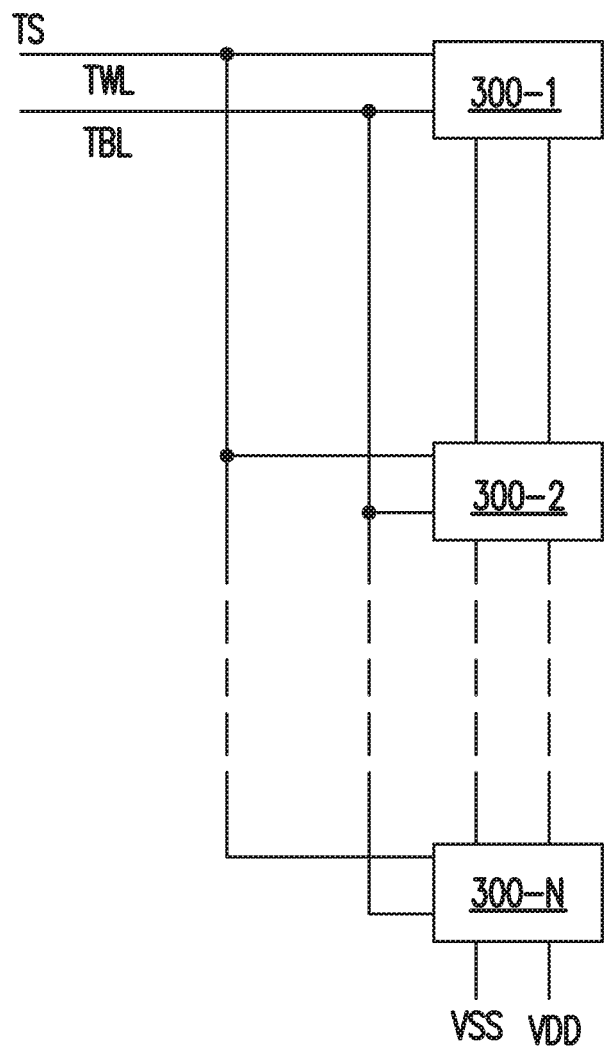
FIG. 3 is a diagram of a tracking cell set, in accordance with some embodiments.

FIG. 3 is a diagram of a tracking cell set 300, in accordance with some embodiments. Tracking cell set 300 is usable as one or more of tracking cell sets 114A, 114B, or 114C, discussed above with respect to FIG. 1.

Tracking cell set 300 includes N tracking cells 300-1 through 300-N, each of which is electrically coupled with tracking bit line TBL discussed above with respect to FIG. 1, communicatively coupled with a tracking word line TWL, and configured to receive reference voltage VSS and power supply voltage VDD. Tracking word line TWL is usable as one of tracking word lines TWLA, TWLB, or TWLC, each discussed above with respect to FIG. 1.

Each of tracking cells 300-1 through 300-N is configured to, responsive to a logical state of tracking word line signal TS on tracking word line TWL, electrically couple with tracking bit line TBL, thereby causing tracking bit line TBL to discharge to reference voltage VSS. Tracking cells 300-1 through 300-N are thereby configured to operate in parallel to discharge tracking bit line TBL as discussed above with respect to memory circuit 100 and FIG. 1.

Figure 4:
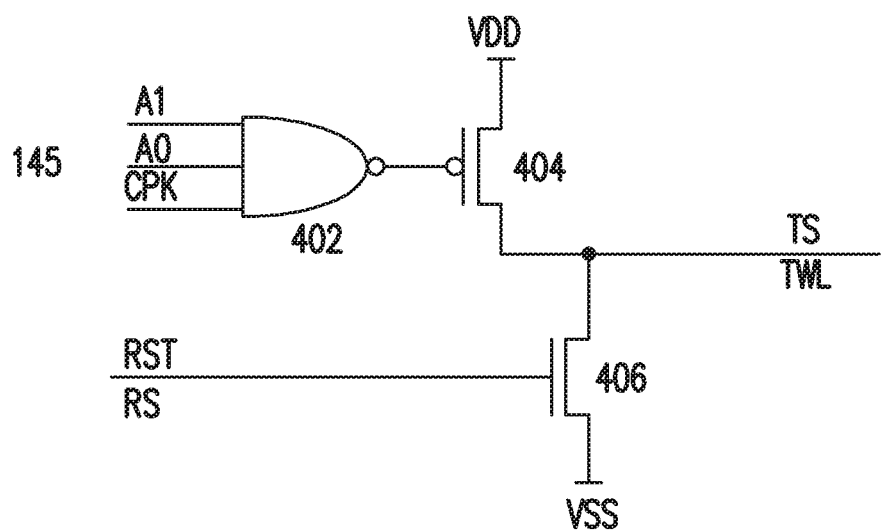
FIG. 4 is a diagram of a tracking word line driver, in accordance with some embodiments.

FIG. 4 is a diagram of a tracking word line driver 400, in accordance with some embodiments. Tracking word line driver 400 is usable as one or more of tracking word line drivers 130A, 130B, or 130C, discussed above with respect to FIG. 1.

Tracking word line driver 400 includes a NAND gate 402, a transistor 404, and a transistor 406. NAND gate 402 has input terminals communicatively coupled with address information bus 145 and an output terminal communicatively coupled with a gate terminal of transistor 404. Transistor 404 also includes a source terminal configured to receive power supply voltage VDD and a drain terminal communicatively coupled with tracking word line TWL. Transistor 406 includes a drain terminal communicatively coupled with tracking word line TWL, a gate terminal communicatively coupled with reset line RS, and a source terminal configured to receive reference voltage VSS.

The input terminals of NAND gate 402 are configured to receive address signals A0 and A1 of address signals ADDR and timing signal CPK on address information bus 145. NAND gate 402 is configured to, responsive to logical states of address signals A0 and A1 and timing signal CPK, generate a low logical state on the output terminal when the logical states of address signals A0 and A1 and timing signal CPK correspond to a read operation on a memory cell in a region with which tracking word line driver 400 is associated, and otherwise generate a high logical state on the output terminal.

Responsive to the low logical state on the output terminal of NAND gate 402, transistor 404 is configured to electrically couple tracking word line TWL with power supply voltage VDD, thereby generating tracking signal TS having a high logical state with a pulse width in accordance with the duration of the low logical state on the output of NAND gate 402.

Transistor 406 is configured to, responsive to a high logical state of reset signal RST on reset line RS, electrically couple tracking word line TWL with reference voltage VSS, thereby generating tracking signal TS having a low logical state on tracking word line TWL. Responsive to a low logical state of reset signal RST on reset line RS, transistor 406 is configured to electrically decouple tracking word line TWL from reference voltage VSS.

In the embodiment depicted in FIG. 4, tracking word line driver 400 is configured to output tracking signal TS based on two address signals of address signals ADDR. In various embodiments, tracking word line driver 400 is configured to output tracking signal TS based on more than two address signals of address signals ADDR.

In the embodiment depicted in FIG. 4, tracking word line driver 400 includes NAND gate 402 and transistors 404 and 406 configured as described above so as to output tracking signal TS based on the address and timing information received on address information bus 145 and reset signal RST received on reset line RS. In various embodiments, tracking word line driver 400 does not include one or more of NAND gate 402, transistor 404, or transistor 406, and/or includes one or more logic gates or other circuit elements (not shown) such that tracking word line driver 400 is otherwise configured to output tracking signal TS based as described on the address and timing information received on address information bus 145 and reset signal RST received on reset line RS.

Tracking word line driver 400 is thereby configured to operate to generate one or more of tracking word line signals TSA, TSB, or TSC as discussed above with respect to memory circuit 100 and FIG. 1.

Figure 5A:
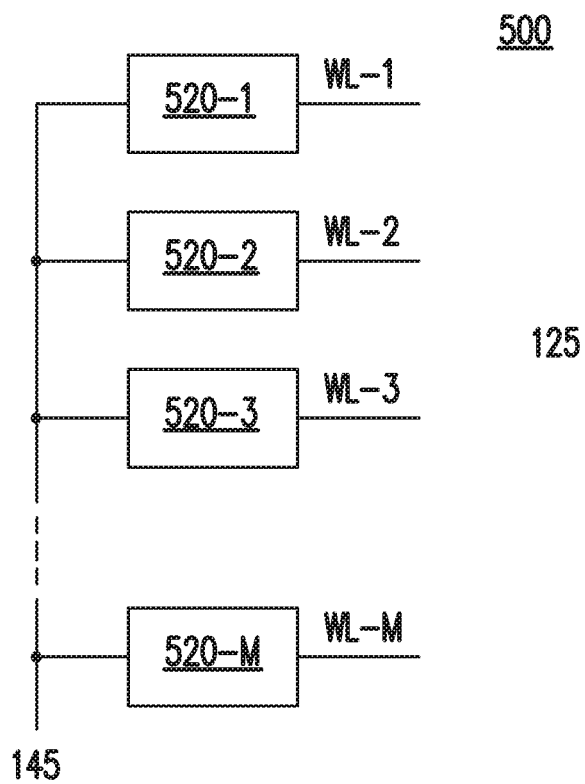
FIGS. 5A and 5B are diagrams of word line drivers, in accordance with some embodiments.
Figure 5B:
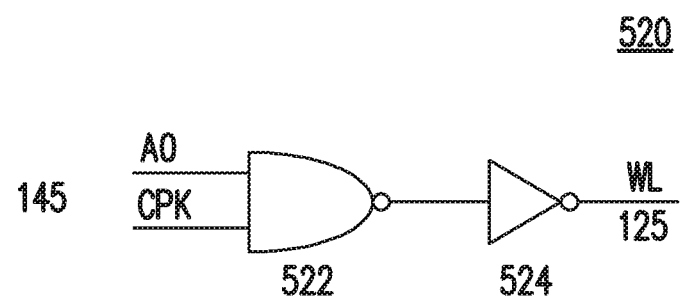

FIGS. 5A and 5B are diagrams of a plurality of word line drivers 500 including word line drivers 520, in accordance with some embodiments. Plurality of word line drivers 500 is usable as plurality of word line drivers 120 discussed above with respect to FIG. 1.

As depicted in FIG. 5A, plurality of word line drivers 500 includes M word line drivers 520-1 through 520-M, each of which is communicatively coupled with address information bus 145 and with word line bus 125.

The number M of word line drivers in plurality of word line drivers 500 matches the number of memory cells in plurality of memory cells 110 discussed above with respect to FIG. 1. Accordingly, word line drivers 520-1 through 520-M are configured to output corresponding word line signals WL-1 through WL-M on word line bus 125, each of word line signals WL-1 through WL-M corresponding to a memory cell in plurality of memory cells 110.

Because each word line driver of plurality of word line drivers 500 is associated with a memory cell of plurality of memory cells 110, subsets (not labeled) of plurality of word line drivers 500 are associated with subsets 112A, 112B, and 112C discussed above with respect to FIG. 1.

As depicted in FIG. 5B, each word line driver 520 of plurality of word line drivers 500 includes a NAND gate 522 and an inverter 524. NAND gate 522 includes input terminals communicatively coupled with address information bus 145 and an output terminal communicatively coupled with an input terminal of inverter 524. Inverter 54 also includes an output terminal communicatively coupled with word line bus 125.

The input terminals of NAND gate 522 are configured to receive address signal A0 of address signals ADDR and timing signal CPK on address information bus 145. NAND gate 522 is configured to, responsive to logical states of address signal A0 and timing signal CPK, generate a low logical state on the output terminal when the logical states of address signal A0 and timing signal CPK correspond to a read operation on a memory cell corresponding to word line driver 500, and otherwise generate a high logical state on the output terminal.

Responsive to the low logical state on the output terminal of NAND gate 522, inverter 524 is configured to generate signal WL having a high logical state with a pulse width in accordance with the duration of the low logical state on the output of NAND gate 522. Responsive to the high logical state on the output terminal of NAND gate 522, inverter 524 is configured to generate signal WL having a low logical state.

In the embodiment depicted in FIG. 5B, word line driver 520 is configured to output word line signal WL based on one address signal of address signals ADDR. In various embodiments, word line driver 520 is configured to output word line signal WL based on more than one address signal of address signals ADDR.

In the embodiment depicted in FIG. 5B, word line driver 520 includes NAND gate 522 and inverter 524 configured as described above so as to output word line signal WL based on the address and timing information received on address information bus 145. In various embodiments, word line driver 520 does not include one or more of NAND gate 522 or inverter 524, and/or includes one or more logic gates or other circuit elements (not shown) such that word line driver 520 is otherwise configured to output word line signal WL based as described on the address and timing information received on address information bus 145.

Plurality of word line drivers 500 including word line drivers 520 is thereby configured to operate to generate each of word line signals WL as discussed above with respect to memory circuit 100 and FIG. 1.

Figure 6:
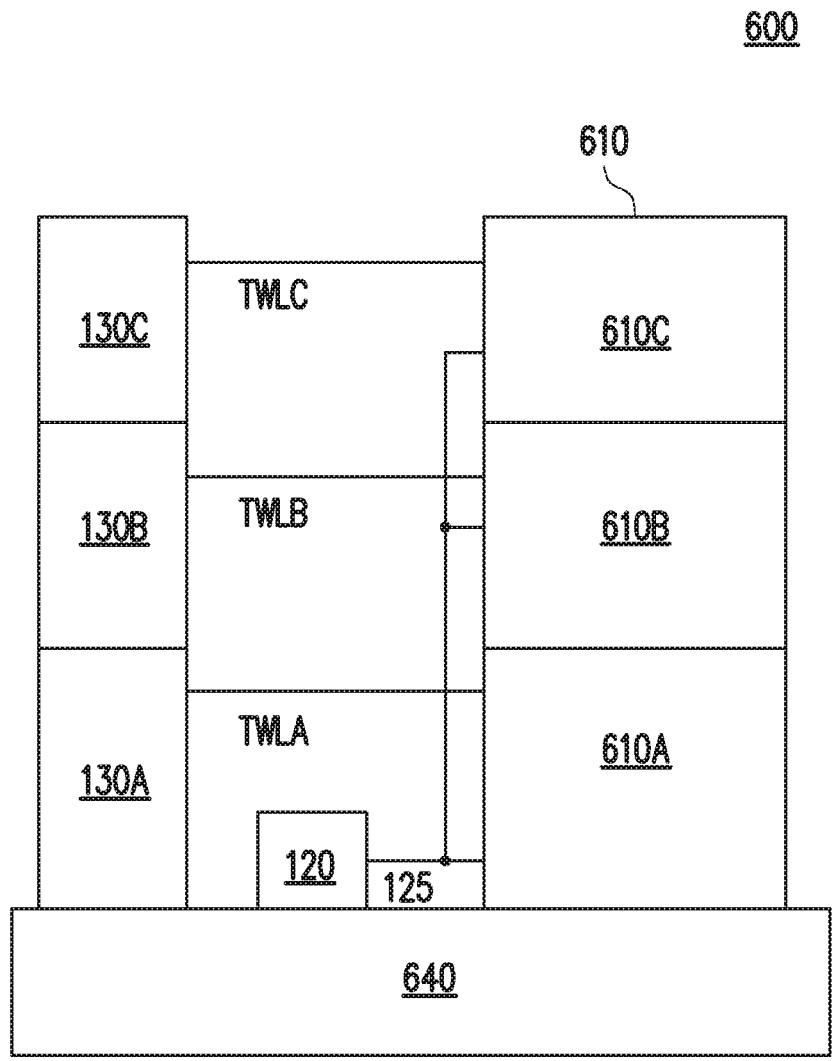
FIG. 6 is a diagram of a memory circuit, in accordance with some embodiments.

FIG. 6 is a diagram of a memory circuit 600, in accordance with some embodiments. Memory circuit 600 is a subset of a memory macro and includes an array of memory cells 610 and an input-output circuit 640. Memory circuit 600 also includes plurality of word line drivers 120, word line bus 125, tracking word line drivers 130A, 130B, and 130C, and tracking word lines TWLA, TWLB, and TWLC, each of which is discussed above with respect to FIG. 1.

Array of memory cells 610 includes columns and rows of memory cells in which each column corresponds to an instance of plurality of memory cells 110, and each row corresponds to a word in which all of the memory cells of the word are communicatively coupled with a single word line and configured to respond to a single word line signal WL.

Array of memory cells 610 includes regions 610A, 610B, and 610C, analogous to regions 110A, 110B, and 110C discussed above with respect to FIG. 1. Accordingly, tracking word line driver 130A and tracking word line TWLA are associated with region 610A, tracking word line driver 130B and tracking word line TWLB are associated with region 610B, and tracking word line driver 130C and tracking word line TWLC are associated with region 610C, each in the manner described above with respect to regions 110A, 110B, and 110C of memory circuit 100 depicted in FIG. 1.

Input-output circuit 640 includes one or more circuits configured to perform the functions of decoder 140, address information bus 145, tracking circuit 150, reset line RS, sense amplifier 160, and enable line EN, each discussed above with respect to memory circuit 100 and FIG. 1.

By the configuration discussed above, memory circuit 600 is capable of having relative timing between regions 610A, 610B, and 610C as discussed above with respect to regions 110A, 110B, and 110C, thereby reducing average power consumption compared to other approaches, as discussed above with respect to memory circuit 100.

FIG. 7 is a flowchart of a method 700 of performing a read operation on a memory cell, in accordance with one or more embodiments. Method 700 is usable with a memory circuit, e.g., memory circuits 100 and 600, discussed above with respect to FIGS. 1 and 6.

The sequence in which the operations of method 700 are depicted in FIG. 7 is for illustration only; the operations of method 700 are capable of being executed in sequences that differ from that depicted in FIG. 7. In some embodiments, operations in addition to those depicted in FIG. 7 are performed before, between, during, and/or after the operations depicted in FIG. 7. In some embodiments, the operations of method 700 are a subset of operations of a method of operating a memory circuit.

At operation 710, a memory cell is activated. Activating the memory cell includes coupling the memory cell with a bit line, thereby causing the bit line to be charged or discharged while the memory cell is active. Charging or discharging the bit line includes the memory cell causing current to flow in the bit line.

The memory cell is one memory cell of a plurality of memory cells coupled with the bit line. In various embodiments, activating the memory cell includes activating a memory cell of plurality of memory cells 110, discussed above with respect to FIG. 1, or a memory cell of plurality of memory cells 610, discussed above with respect to FIG. 6.

In some embodiments, activating the memory cell includes responding to a word line signal on a word line coupled with the memory cell, the word line signal having a pulse width based on a distance between the memory cell and a sense amplifier coupled with the bit line. In some embodiments, responding to a word line signal includes responding to word line signal WL discussed above with respect to FIG. 2.

At operation 720, in some embodiments, a tracking cell is activated using a tracking word line driver of a plurality of tracking word line drivers. Activating the tracking cell includes coupling the tracking cell with a tracking bit line, thereby causing the tracking bit line to be charged or discharged while the tracking cell is active.

The tracking cell is one tracking cell of a plurality of tracking cells corresponding to the plurality of tracking word line drivers, each tracking cell of the plurality of tracking cells being coupled with the tracking bit line. In some embodiments, each tracking cell of the plurality of tracking cells is included in a tracking cell set of a plurality of tracking cell sets corresponding to the plurality of tracking word line drivers, and activating a given tracking cell includes activating each tracking cell of the corresponding tracking cell set. In some embodiments, activating the tracking cell includes activating one of tracking cell sets 114A, 114B, or 114C discussed above with respect to FIG. 1.

Using the tracking word line driver includes outputting a tracking word line signal having a pulse width based on a distance between the tracking cell and a tracking circuit coupled with the tracking bit line. In some embodiments, using the tracking word line driver includes using one of tracking word line drivers 130A, 130B, or 130C discussed above with respect to FIGS. 1 and 6, or tracking cell 400 discussed above with respect to FIG. 4. In some embodiments, outputting a tracking word line signal includes outputting tracking word line signal TS discussed above with respect to FIG. 2.

In some embodiments, using the tracking word line driver includes selecting the tracking word line driver of the plurality of tracking word line drivers based on an address of the memory cell. In some embodiments, selecting the tracking word line driver includes the tracking word line driver responding to address signals ADDR discussed above with respect to FIG. 1.

At operation 730, in some embodiments, a charged or discharged status of the tracking bit line is detected. Detecting the charged or discharged status includes determining that a voltage level on the tracking bit line is within a predetermined threshold of a target voltage value. In some embodiments, detecting the charged or discharged status includes using tracking circuit 150 discussed above with respect to FIG. 1, or input-output circuit 640 discussed above with respect to FIG. 6.

At operation 740, the sense amplifier is activated. A delay between activating the word line and enabling the sense amplifier is based on the distance between the memory cell and the sense amplifier. The distance between the memory cell and the sense amplifier corresponds to a distance between the tracking cell and the tracking circuit, and basing the delay on the distance between the memory cell and the sense amplifier includes the tracking cell charging or discharging the tracking bit line to be within the predetermined threshold of the target voltage value at an input to the tracking circuit.

Enabling the sense amplifier includes the sense amplifier receiving an enable signal having a timing based on the distance between the tracking cell and the tracking circuit. In some embodiments, receiving the enable signal includes receiving enable signal SAE discussed above with respect to FIGS. 1 and 2.

In some embodiments, enabling the sense amplifier includes enabling sense amplifier 160 discussed above with respect to FIG. 1, or input-output circuit 640 discussed above with respect to FIG. 6.

At operation 750, in some embodiments, the memory cell is deactivated. Deactivating the memory cell includes decoupling the memory cell from the bit line, thereby causing the bit line to cease being charged or discharged by the current that would otherwise flow in response to the memory cell being coupled with the bit line.

In some embodiments, deactivating the memory cell includes responding to the word line signal on the word line coupled with the memory cell, the word line signal having the pulse width based on the distance between the memory cell and the sense amplifier. In some embodiments, responding to the word line signal includes responding to word line signal WL discussed above with respect to FIG. 2.

By executing the operations of method 700, a memory circuit is capable of having relative timing between memory cell regions as discussed above with respect to FIGS. 1 and 2, thereby reducing average power consumption compared to other approaches, as discussed above with respect to memory circuit 100 and FIG. 1.

In some embodiments, a circuit includes a plurality of memory cells, a first tracking word line driver configured to output a first signal in response to a first region of the plurality of memory cells being accessed, the first signal having a first pulse width, and a second tracking word line driver configured to output a second signal in response to a second region of the plurality of memory cells being accessed, the second signal having a second pulse width, the second pulse width being different from the first pulse width.

In some embodiments, a circuit includes an array of memory cells including a plurality of regions, each region of the plurality of regions corresponding to a subset of rows of the array of memory cells, and a plurality of word line drivers, each word line driver of the plurality of word line drivers being associated with a region of the plurality of regions. Each word line driver of the plurality of word line drivers is configured to output a word line signal having a pulse width that varies according to the associated region of the array of memory cells.

In some embodiments, a method of performing a read operation on a memory cell includes activating the memory cell, and enabling a sense amplifier coupled with the memory cell. A delay between activating the memory cell and enabling the sense amplifier is based on a distance between the memory cell and the sense amplifier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
a plurality of memory cells comprising a first region and a second region;
a plurality of word line drivers;
a first tracking word line driver; and
a second tracking word line driver, wherein
in response to an address signal indicative of an address of a first memory cell in a first row of the first region,
the plurality of word line drivers is configured to output a first word line signal to the first row, and
the first tracking word line driver is configured to output a first signal to the first region, the first signal being separate from the first word line signal and having a first pulse width, and
in response to the address signal indicative of an address of a second memory cell in a second row of the second region,
the plurality of word line drivers is configured to output a second word line signal to the second row, and
the second tracking word line driver is configured to output a second signal to the second region, the second signal being separate from the first signal and the second word line signal and having a second pulse width different from the first pulse width.

2. The circuit of claim 1, wherein the circuit is configured to
perform a first read operation on the first region of the plurality of memory cells based on the first pulse width for a predetermined time period, and
perform a second read operation on the second region of the plurality of memory cells based on the second pulse width for the predetermined time period.

3. The circuit of claim 1, further comprising a tracking bit line, wherein
the first region of the plurality of memory cells comprises a first tracking cell set configured to be coupled with the tracking bit line responsive to the first signal, and
the second region of the plurality of memory cells comprises a second tracking cell set configured to be coupled with the tracking bit line responsive to the second signal.

4. The circuit of claim 3, further comprising:
a tracking circuit configured to generate an enable signal responsive to a voltage level on the tracking bit line; and
a sense amplifier coupled with the plurality of memory cells, the sense amplifier configured to detect logical states of the memory cells of the plurality of memory cells responsive to the enable signal.

5. The circuit of claim 4, wherein
the memory cells of the first region of the plurality of memory cells are closer to the sense amplifier than the memory cells of the second region of the plurality of memory cells, and
the first pulse width is smaller than the second pulse width.

6. The circuit of claim 4, wherein
the tracking circuit is configured to generate a reset signal responsive to the voltage level on the tracking bit line,
the first tracking word line driver is configured to output the first signal having the first pulse width based on the reset signal, and
the second tracking word line driver is configured to output the second signal having the second pulse width based on the reset signal.

7. The circuit of claim 1, further comprising an address decoder configured to output the address signal.

8. The circuit of claim 1, further comprising:
a first logic circuit configured to activate the first tracking word line driver in response to the address signal indicative of the address of the first memory cell; and
a second logic circuit configured to activate the second tracking word line driver in response to the address signal indicative of the address of the second memory cell.

9. The circuit of claim 8, wherein
the first logic circuit is configured to deactivate the first tracking word line driver in response to a reset signal, and
the second logic circuit is configured to deactivate the second tracking word line driver in response to the reset signal.

10. The circuit of claim 9, wherein each word line driver of the plurality of word line drivers is configured to
couple an associated memory cell of the plurality of memory cells with a bit line in response to the address signal indicative of an address of the associated memory cell of the plurality of memory cells, and
decouple the associated memory cell of the plurality of memory cells from the bit line in response to the reset signal.

11. A circuit comprising:
a plurality of tracking cell sets;
an array of memory cells comprising a plurality of regions, each region of the plurality of regions comprising:
a subset of rows of the array of memory cells; and
a tracking cell set of the plurality of tracking cell sets; and
a plurality of word line drivers, each word line driver of the plurality of word line drivers being associated with a region of the plurality of regions,
wherein
each word line driver of the plurality of word line drivers is configured to output a word line signal having a pulse width that varies according to the associated tracking cell set of the plurality of tracking cell sets, wherein at least two of the word line drivers are configured to generate word line signals having different pulse widths and
each tracking cell set of the plurality of tracking cell sets is configured to be controlled separately from each other tracking cell set of the plurality of tracking cell sets and separately from the associated word line driver.

12. The circuit of claim 11, further comprising an input-output circuit coupled with the array of memory cells, wherein the pulse width of the word line signal of each word line driver of the plurality of word line drivers increases as a distance from the associated region of the array of memory cells to the input-output circuit increases.

13. The circuit of claim 12, wherein
each tracking cell set of the plurality of tracking cell sets is responsive to an associated tracking word line signal output by an associated tracking word line driver,
the input-output circuit is configured to generate a reset signal responsive to timings of the tracking cell sets of the plurality of tracking cell sets, and
the pulse width of the word line signal output by each word line driver is based on the reset signal.

14. The circuit of claim 13, wherein
the input-output circuit is configured to perform a read operation on a given row of the array of memory cells, and
the read operation is performed for a predetermined time period based on the reset signal.

15. The circuit of claim 13, further comprising a plurality of tracking word lines, each tracking word line of the plurality of tracking word lines being coupled between a corresponding tracking word line driver and a corresponding tracking cell set of the plurality of tracking cell sets.

16. A method of performing a read operation on a memory cell, the method comprising:
responsive to a plurality of address signals, generating a word line signal with a tracking word line driver of a plurality of tracking word line drivers and a tracking signal separate from the word line signal, wherein the tracking word line driver generates the word line signal to have a pulse width and at least an other one of the plurality of word line drivers is configured to generate an other word line signal having an other pulse width different than the pulse width of the word line signal;
simultaneously activating the memory cell and a tracking cell, the memory cell and tracking cell being located in a same region of a memory array; and
enabling a sense amplifier coupled with the memory cell based on the pulse width of the word line signal,
wherein
the activating the memory cell comprises responding to the word line signal corresponding to the plurality of address signals being indicative of an address of the memory cell,
the activating the tracking cell comprises responding to the tracking signal corresponding to the plurality of address signals being indicative of the address of the memory cell, and
a delay between the activating the memory cell and the enabling the sense amplifier is based on a distance between the region and the sense amplifier.

17. The method of claim 16, further comprising:
generating the tracking signal using the tracking word line driver of the plurality of tracking word line drivers to cause the tracking cell to couple to the tracking bit line; and
detecting a charged or discharged status of a tracking bit line coupled with the tracking cell,
wherein the enabling the sense amplifier is in response to the detecting a charged or discharged status of the tracking bit line.

18. The method of claim 17, wherein the using the tracking word line driver comprises selecting the tracking word line driver of the plurality of tracking word line drivers based on the plurality of address signals being indicative of the address of the memory cell.

19. The method of claim 17, further comprising deactivating the memory cell.

20. The method of claim 16, wherein the activating the memory cell comprises responding to the word line signal on a word line coupled with the memory cell, the pulse width being based on the distance between the region and the sense amplifier.

* * * * *